(12) United States Patent
Dirks et al.

(10) Patent No.: US 8,133,764 B2
(45) Date of Patent: Mar. 13, 2012

(54) EMBEDDED INDUCTOR AND METHOD OF PRODUCING THEREOF

(75) Inventors: Peter Dirks, Valkenswaard (NL); Klaas Heres, Berkel en Rodenrijs (NL)

(73) Assignee: NPX B.V., Eindhoven (NL)

( * ) Notice: Subject to any disclaimer, the term of this patent is extended or adjusted under 35 U.S.C. 154(b) by 350 days.

(21) Appl. No.: 12/526,678

(22) PCT Filed: Feb. 11, 2008

(86) PCT No.: PCT/IB2008/050485
§ 371 (c)(1),
(2), (4) Date: Aug. 11, 2009

(87) PCT Pub. No.: WO2008/099327
PCT Pub. Date: Aug. 21, 2008

(65) Prior Publication Data
US 2010/0025840 A1  Feb. 4, 2010

(30) Foreign Application Priority Data
Feb. 14, 2007 (EP) ..................... 07003107

(51) Int. Cl.
*H01L 23/522* (2006.01)
(52) U.S. Cl. .. 438/124; 438/614; 257/690; 257/E21.502

(58) Field of Classification Search .................. 438/124, 438/614; 257/690, E21.502, E23.142
See application file for complete search history.

(56) References Cited

U.S. PATENT DOCUMENTS

| | | | | |
|---|---|---|---|---|
| 5,428,245 | A * | 6/1995 | Lin et al. | 257/666 |
| 5,598,032 | A * | 1/1997 | Fidalgo | 257/679 |
| 6,335,564 | B1 * | 1/2002 | Pour | 257/666 |
| 6,451,627 | B1 | 9/2002 | Coffman | |

FOREIGN PATENT DOCUMENTS

| | | |
|---|---|---|
| JP | 06104372 A | 4/1994 |
| WO | 03085728 A1 | 10/2003 |

* cited by examiner

Primary Examiner — Roy Potter

(57) ABSTRACT

A method of manufacturing an inductor embedded into a semiconductor chip package (100) is described, which method comprises providing a carrier (102; 202; 302) having, between a first side and an opposite second side, a first conductive layer (104; 503), an intermediate layer (205; 505), a second conductive layer (106; 504), forming an inductor and contact pads for the chip by patterning the first conductive layer (104; 503) from the first side of the carrier (102; 202; 302), assembling the chip and providing an encapsulation (514) and forming terminals of the package, by patterning the second conductive layer (106; 504) from the second side of the carrier.

10 Claims, 4 Drawing Sheets

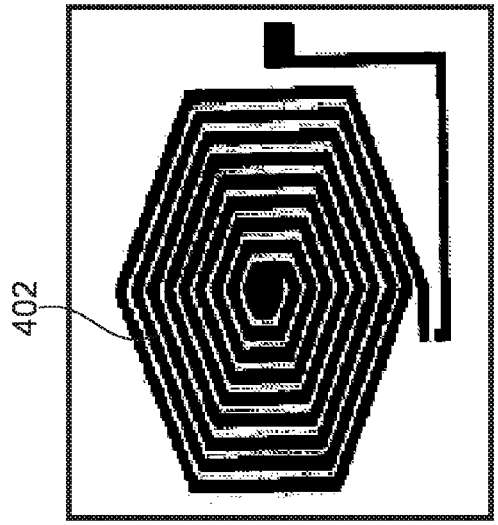
Fig. 4a
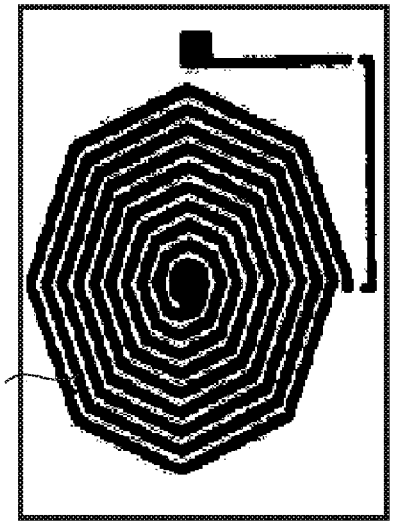
Fig. 4b
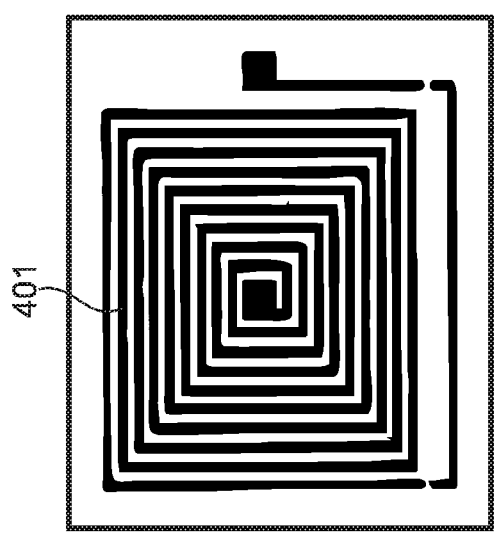
Fig. 4c
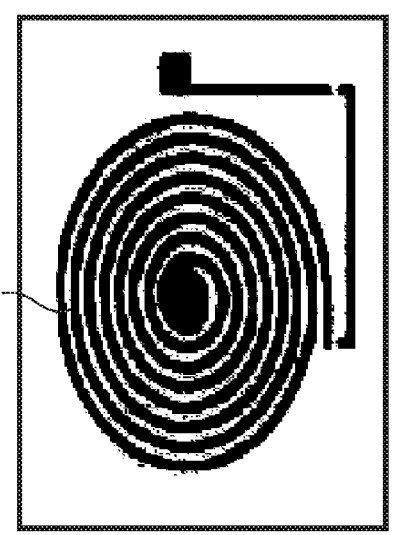
Fig. 4d
Fig. 4

EMBEDDED INDUCTOR AND METHOD OF PRODUCING THEREOF

FIELD OF THE INVENTION

The invention relates to an embedded inductor.

Moreover, the invention relates to a method of producing an embedded inductor.

BACKGROUND OF THE INVENTION

In the field of semiconductor devices combinations of an inductive coil and integrated circuit semiconductor chip are known which are formed in a single lead frame package which comprises, in combination a single package, a lead frame located in the single package and having a coil configuration, the lead frame located in one horizontal plane, and an integrated circuit semiconductor chip located in the single package and coupled to the lead frame and having at least one terminal pad electrically connected to at least one portion of the coil configuration of the lead frame. Usually, the integrated circuit semiconductor chip has at least two terminal pads, one of the two terminal pads of the integrated circuit semiconductor chip being electrically connected to one end portion of the coil configuration of the lead frame, the other of the two terminal pads of the integrated circuit semiconductor chip being electrically connected to the other end portion of the coil configuration of the lead frame.

The coil configuration of the lead frame having, for example, three attached tie members which have been cut off from the tie members of adjacent similarly configured coil shaped lead frames that were, for example, stamped out in one metal stamping operation used to form a number of these coil shaped lead frames at one time for subsequent separation into individual coil shaped lead frame elements. The tie bars functions to hold the coil and a die paddle in the same plane.

However, the known inductive coils may require a rather great area leading to a limitation in the miniaturization of Integrated Circuits. Furthermore, such tie bars may have influence on the electrical properties of the coil, which influence is difficult to predict and hence difficult to handle in particular in mass production, which is a drawback.

OBJECT AND SUMMARY OF THE INVENTION

It is an object of the invention to reduce the area needed by an inductor embedded into a package.

In order to achieve the object defined above, a method of manufacturing a chip package with an embedded inductor and a resulting chip package according to the independent claims are provided.

According to an exemplary embodiment of the invention, a method of manufacturing an inductor embedded into a package is provided, which method comprises providing a carrier having, between a first side and an opposite second side, a first conductive layer, an intermediate layer, a second conductive layer, forming an inductor and contact pads of the chip by patterning the first conductive layer from the first side of the carrier, assembling the chip, providing an encapsulation and forming terminals of the package by patterning the second conductive layer from the second side of the carrier.

According to an exemplary embodiment of the invention, a package, is provided, comprising a plurality of mutually isolated conductive patterns obtainable by selective etching of a carrier comprising a first etch mask, a first conductive layer, an intermediate layer, and a second conductive layer, in which first etch mask and which first conductive layer of which carrier at least one coil configuration and a plurality of contact pads are defined, and in which second conductive layer terminals are defined that are connected to at least some of the contact pads. A semiconductor chip is assembled to at least one of the conductive patterns and electrically coupled to at least some of the contact pads. An encapsulation of electrically insulating material around the semiconductor chip and around the coil configuration, which is defined such that the terminals are present in a plane at a distance from the encapsulation.

The carrier may in particular form a sandwich structure comprising the first conductive layer, the intermediate layer, which may also be called buffer layer, and the second conductive layer, wherein the first side is situated on that side the first conductive layer is positioned and the second side is situated on that side the second conductive layer is positioned. The first and second conductive layers may be formed by metal layers and may be thus in particular electrical conductive layers. In particular, the package may form an Integrated Circuit (IC) or a part thereof. Preferably, the embedded inductor is solely formed from the material of the first conductive layer which may lead to the effect that physical parameters like thickness and/or inductivity of the inductor may be at least partially defined by the parameters of the first conductive layer. For example, to provide a thicker inductor, the thickness of the first conductive layer may be increased.

The term "embedded inductor" may particularly denote the fact that the inductor is embedded into the carrier or package, e.g. by forming the inductor together with the rest of the structures of the package, wherein an inductor may particularly denote an electric or electronic component having a deliberately predefined value of inductance and may be thus delimitable from a common conductor or wire. The inductor may be a part of an Ultra-Thin-Leadless-Package (UTLP) lead frame and may be masked and etched in a lead frame manufacturing process. Thus, an embedded inductor may be distinguished from an inductor, which is stamped out and afterwards disposed or bonded onto a carrier. Another term for such an inductor may be "integrated inductor".

It may be seen as a gist of an exemplary embodiment that the inductor is defined in the carrier of the package. Nevertheless, the inductor does not extend from the package in the manner that the terminals do. As a consequence, the ability of soldering the package to a printed circuit board or another component is not affected.

A further advantage from the design perspective of the present invention is the ability to define within the package inductors of different size, shape and quality factor in merely one manner. Additionally different inductors may be combined in one design. This is particularly the case for the UTLP frame as referred to above, which comprises an electrically conductive etch mask on top of the first conductive layer. Examples of such embedded coils include RF inductors, embedded coils for use in power applications, as well as antennas for wireless transmission of data and energy. The mere factor defining the resulting inductor is the shape and track width of patterns defined in the first etch mask, as well as the thickness of the first conductive layer.

One particular version of the embedded inductor is an inductor with a small track width, which will be defined purely in the etch mask. This is the consequence of the underetching. Although the resulting inductor has a small thickness, it is fully embedded in the encapsulation, and its shape is fine. It is therefore considered suitable for RF applications, such as in RF filters. It makes sense to define such a fine inductor in the package instead of in the chip, as the inductor would be a large inductor when defined in the chip.

Moreover shielding is not necessary in the package or can be enabled in a straightforward manner.

The integration of an embedded coil is particularly suitable in combination with semiconductor devices for power applications. Such semiconductor devices may be discrete power semiconductor elements or integrated circuits. One application is the provision of a current source by combination of the inductor with a voltage source. Another even more important application is the use of the inductor as part of a DC-DC converter circuit. The presence of an embedded inductor near to the chip (i.e. adjacent or below the chip) allows short connections between the inductor and the chip, and hence the electrical losses may be reduced.

Next, further exemplary embodiments of the method of manufacturing an inductor embedded into a package are described. However, these embodiments also apply to the package.

According to another exemplary embodiment of the method the embedded inductor is an embedded coil with a spiral shape or an embedded dipole antenna.

According to another exemplary embodiment of the package an additional inductor is embedded into the first layer. In particular, a second inductor, e.g. a second coil, may be embedded into the same package, wherein the second inductor is as well formed from the first conductive layer. The first and second inductor may have different sizes and or value of their respective inductance.

An exemplary aspect of the invention may be seen in the fact that a method for producing an embedded inductor, e.g. a coil, is provided. The embedded coil may be a part of an Ultra-Thin-Leadless-Package (UTLP), i.e. may be embedded in the lead frame structure of the UTLP. The UTLP may be produced from a multilayer carrier comprising a plurality of layers, wherein the embedded coil is manufactured from one of the layers, e.g. by structuring the respective layer by etching. For such an etching process another layer of the multilayer structure may be used as a mask layer. Before the etching of the embedded coil the mask layer itself may be structured, e.g. by an etching process. Thus, the coil pattern may be firstly formed in the mask layer. If the coil pattern in the mask is made wider, e.g. only smaller regions of the mask layer are removed by the etching so that an under-etching, that usually will arise in the structuring process of the coil, may be reduced, which may result in a wider coil, i.e. a coil having wider lines, with larger dimensions. In case a very thick coil is desired, the UTLP frame thickness, i.e. the thickness of the carrier or at least the thickness of the layer of the carrier, out of which layer the coil will be formed, could be increased. Therefore, the UTLP technique may be suitable for producing inductors of different size and inductors with different Q-factors may be made in a single technology. Such an UTLP may be suitable for a wide range of dimensions, e.g. in number of input/output terminals (I/O) and area. A complete UTLP range may start from about 5 I/O up to 200 I/O and in particular, for packages from 4 mm×4 mm and up. For the design of such a package it may be possible to avoid the necessity to use big trial set up to identify the design rules versus electrical specification, i.e. it might be easier to optimize the design.

The embedded inductor may be provided with a contact pad on one end to which a terminal is connected. In this manner, the inductor ends up outside the package. It could be lead back to the integrated circuit over an electrical connection (interconnect) on the printed circuit board or other substrate if applicable. The inductor could further be coupled to ground. In another embodiment, a wirebonded connection allows the coupling of the inductor to the integrated circuit.

Certain coil designs have both ends at the outside. In such a case, connections may be made with interconnects defined in the carrier.

In a further embodiment, in particular for applications in which the inductor is part of a power application, it is very suitable that the integrated circuit is present on a die pad acting as a heat sink. A quad flat non-leaded (QFN) layout or a double row QFN layout may be used advantageously therewith. However, other than in conventional QFN packages the package of the invention comprises terminals that have a stand-off from the surface of the encapsulation. Additionally, tie bars are not needed. Examples of power applications are for instance an integrated circuit of a power management unit, a power converter and a driver IC for medium or high voltage applications or any other amplifier application. For RF applications, it is important to provide an appropriate grounding. This is usually also achieved in a package with a die pad.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

FIG. 4 shows schematically illustrations of different coil form.

DESCRIPTION OF EMBODIMENTS

Figure 1:
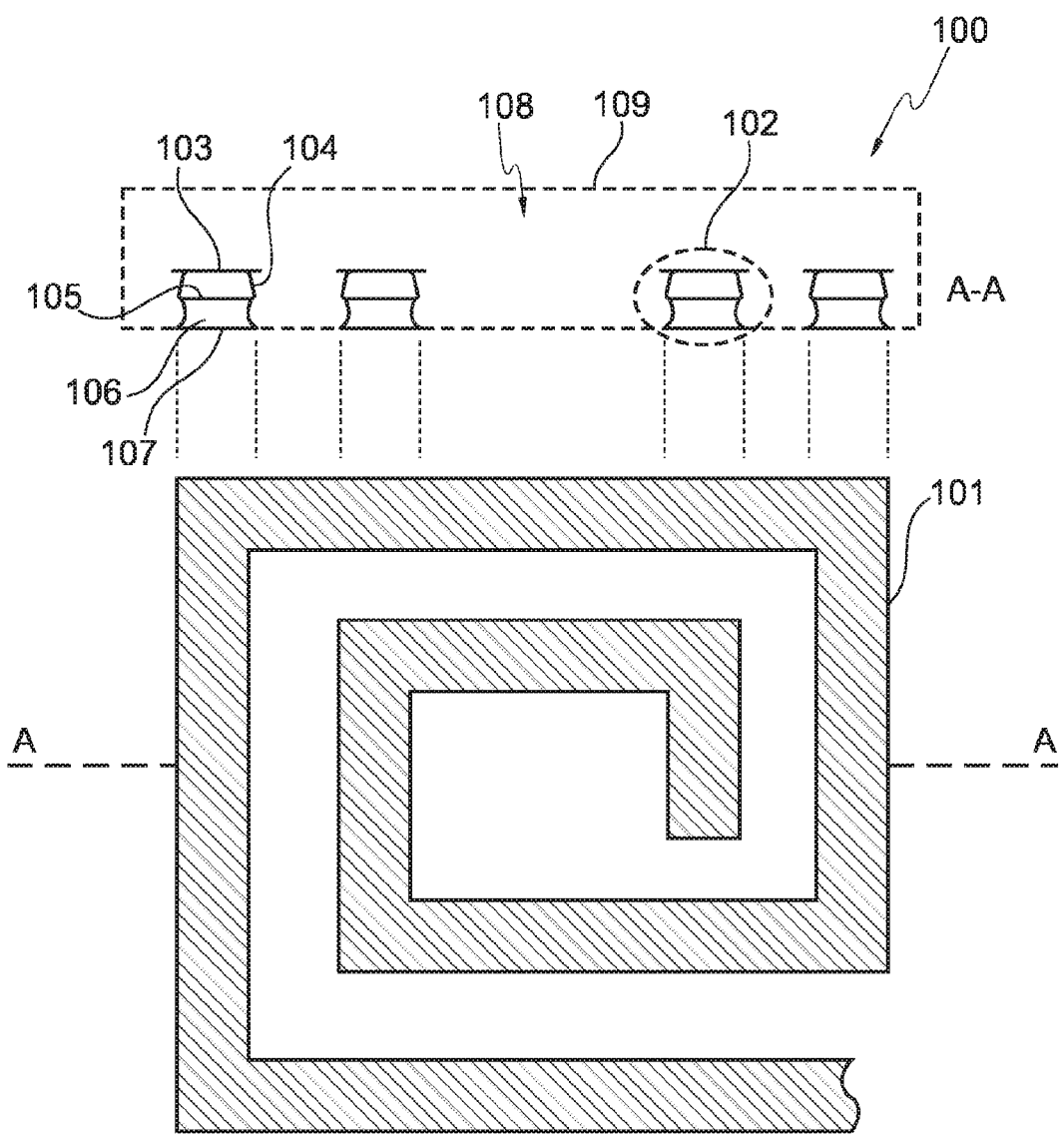
FIG. 1 schematically illustrates an embedded coil according to an exemplary embodiment.

The illustration in the drawing is schematically. In different drawings, similar or identical elements are provided with the same reference signs.

In the following, referring to FIG. 1, a package 100 comprising an embedded coil 101 is described.

In the lower part of FIG. 1 the coil 101 is shown in a top view, while on the upper part of FIG. 1 a cross-sectional view along the line A-A is shown. According to FIG. 1 the coil 101 comprises two full turns. However, coils having more turns are also possible. In the cross-sectional view a multilayer structure 102 of the coil 101 is shown. The multilayer structure 102 in this case comprises five layers. In particular, these five layers are a first mask layer 103, a first metal layer 104, an intermediate or buffer layer 105, a second metal layer 106 and a second mask layer 107. A dashed line 109 schematically indicates an enclosing layer 108 that encloses the multilayer structure 102. A dielectric material, e.g. plastics, may form the enclosing layer.

The coil 101 may be manufactured out of a carrier formed by the multilayer structure 102. For manufacturing the coil the first mask layer 103 may be patterned in such a way that it can be used as an etching mask for the first metal layer 104. The etching of the first metal layer 104 will be performed from that side which is in FIG. 1 the upper side and which can be called a first side of the carrier 102. While etching the first metal layer an under-etching will occur, i.e. the etching will remove a small amount or area of the first metal layer 104 although it is arranged under or covered by the etching mask, i.e. the structured first mask layer 103.

After the etching of the first metal layer 104, the second metal layer 106 may be structured or patterned. For this patterning the second mask layer 107 may be used as an etching mask. That is, the second metal layer 106, which is used to form contacts for the coil 101, is preferably etched from a second side opposite to the first side, i.e. from that side which corresponds to the lower side of the cross-section view A-A in FIG. 1.

Figure 2:
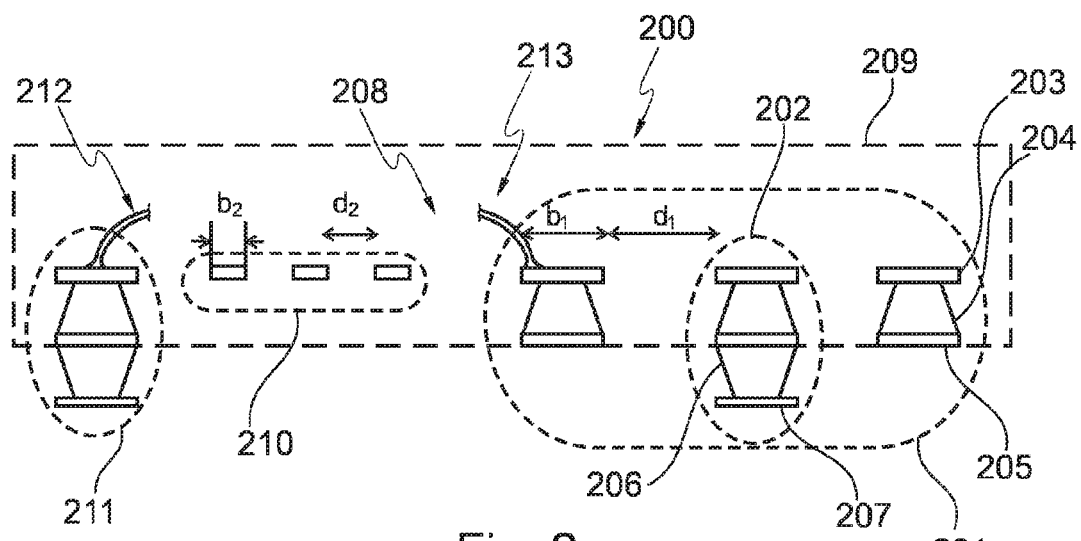
FIG. 2 schematically illustrates a cross sectional view of a two coil arrangement according to another exemplary embodiment.

In the following, referring to FIG. 2, a package 200 comprising two embedded coils 201 and 210 is described. FIG. 2 schematically illustrates a cross sectional view of a two coil arrangement according to another exemplary embodiment.

The respective two coils 201 and 210 are produced from the same carrier or multilayered structure 202. The multilayer structure 202 in this case comprises five layers. In particular, these five layers are a first layer 203, a second layer 204, an intermediate or buffer layer 205, a third layer 206 and a fourth layer 207. Possible materials for the layers of the multilayered structure are described in connection to FIG. 5. A dashed line 209 schematically indicates an enclosing layer 208 that encloses the multilayer structure 202. A dielectric material, e.g. plastics, may form the enclosing layer.

A first one 201 of the two coils, depicted to the right in FIG. 2, is similar to the coil 101 shown in the FIG. 1. The second coil 210, shown to the left of FIG. 2 is a smaller coil, i.e. is less wide and thick, than the first coil 201. This fact is shown by the labels b1, which corresponds to the width of the first coil 201, and b2, which corresponds to the width of the second coil 210. Also the distance between the single turns of the first coil 201, which distance is labeled by d1, is wider than the distance between the single turns of the second coil 210, which is labeled by d2. The smaller width of the second coil 210 leads to the fact that a more pronounced under-etching takes place by etching the second layer 204. This under-etching comes to such an extend that the whole second layer 204 is removed under the second coil 210, while under the first coil 201 significant parts of the second layer 204 are not removed. Thus, the second coil 210 is only build by the first layer 203.

Furthermore, a contact pad 211 is shown in FIG. 2, which can be used to contact the second coil 210. A bond wire 212 may do such a contact or connection. According to the embodiment shown in FIG. 2 the first coil 201 may be contacted as well by a bond wire 213 and/or by the contact that is formed by the fourth layer 206 and fifth layer 207 of the carrier 202.

The external contacting, i.e. the contacting to components external to the package, of the coils 201 and 210 however will be done from the second side of the package, i.e. from the side which is the lower (bottom) side of the structure shown in FIG. 2.

Figure 3:
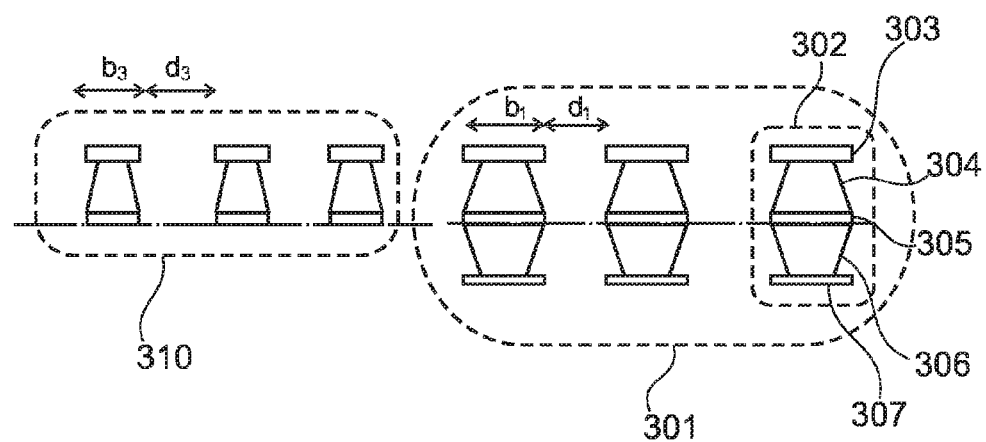
FIG. 3 schematically illustrates a cross sectional view of a two coil arrangement according to another exemplary embodiment.

In the following, referring to FIG. 3, a package 300 comprising two embedded coils is described, that is a first coil 301 and a second coil 310. Hence FIG. 3 schematically illustrates a cross sectional view of a two coil arrangement according to another exemplary embodiment. This arrangement is similar to the arrangement shown in FIG. 2 but differs in such a way that the second coil 310 is somewhat wider than the second coil 210 of FIG. 2.

The respective two coils 301 and 310 are produced from the same carrier or multilayered structure 302. The multilayer structure 302 in this case comprises five layers. In particular, these five layers are a first layer 303, a second layer 304, an intermediate or buffer layer 305, a third layer 306 and a fourth layer 307. Possible materials for the layers of the multilayered structure are described in connection to FIG. 5. The thicknesses of the layers may be in the range of 5 μm to 10 μm for the first layer 303, 40 μm to 50 μm for the second layer 304, about 1 μm for the buffer layer 305, 25 μm to 35 μm for the third layer 306, and 5 μm to 10 μm for the fourth layer 307.

Since the second coil 310 of FIG. 3 is wider than the second coil 210 shown in FIG. 2 the under-etching, which occurs in the etching of the second layer 304, is less pronounced than in FIG. 2 leading to the fact that parts of the second layer 304 still remain under the coil 310.

The external contacting, i.e. the contacting to components external to the package, of the coils 301 and 310 however will be done from the second side of the package, i.e. from the side that is the lower (bottom) side of the arrangement shown in FIG. 3. The second coil 310, shown to the left of FIG. 3 is a smaller coil, i.e. is less wide, than the first coil 301. This fact is shown by the labels b1, which corresponds to the width of the first coil 301, and b3, which corresponds to the width of the second coil 310. Also the distance between the single turns of the first coil 301, which is labeled by d1, is wider than the distance between the single turns of the second coil 310, which is labeled by d3. The smaller width of the second coil 310 leads to the fact that a more pronounced under-etching that takes place by etching the second layer 304 under the turns of the second coil 310. However, this under-etching is less pronounced as in the case of the second coil 210 shown in FIG. 2 since the parameter b3 and d3 have greater values than the parameters b2 and d2.

According to the embodiment shown in FIG. 3 the first coil 301 and the second coil 310 can be contacted as well by a bond wire and/or by the contact that is formed by the fourth layer 306 and fifth layer 307 of the carrier 302.

The external contacting, i.e. the contacting to components external to the package, of the coils 301 and 310 however will be done from the second side of the package, i.e. from the side that is the lower side in FIG. 3.

FIG. 4 shows schematically illustrations of different spiral-shaped coil form, which can be used for producing a package having an embedded coil FIG. 4a shows a coil 401 that has a substantially square shape. FIG. 4b shows a coil 402 that has a substantially hexagonal shape. FIG. 4c shows a coil 403 that has a substantially circular shape. FIG. 4d shows a coil 404 that has a substantially octagonal shape.

Figure 5:
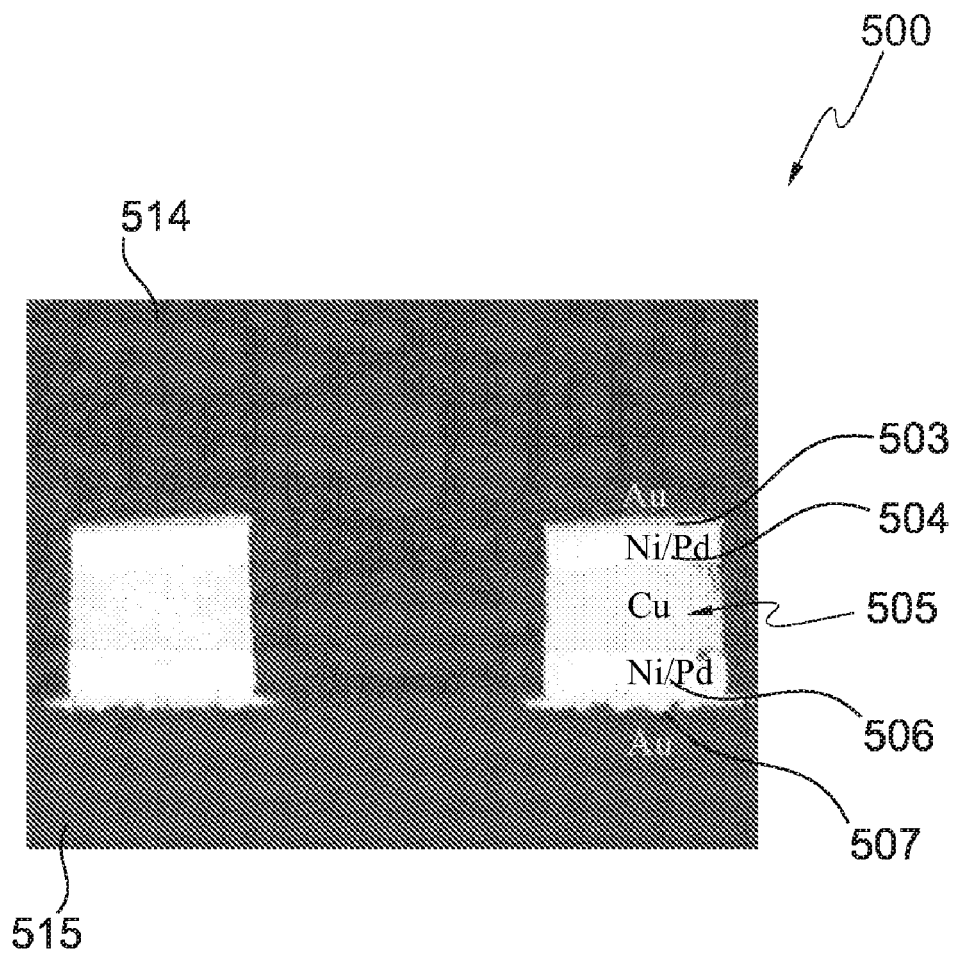
FIG. 5 shows a photograph of a cross-sectional view through a package according to another exemplary embodiment.

FIG. 5 shows a photograph of a cross-sectional view through a package 500 according to another exemplary embodiment. From the photograph two turns of a coil can be seen. In the turn shown to the right in FIG. 5 the multilayered structure can be seen, which arises from a multilayered structure of a carrier used to produce the package. The corresponding layers are a first layer 503 made of gold (Au), a second layer 504 made of nickel and/or palladium (Ni/Pd), an intermediate layer 505 made of copper (Cu), a third layer 506 made of nickel and/or palladium (Ni/Pd), and a fourth layer 507 made of gold (Au). The intermediate layer may form a pillar and may have a thickness between 0 μm, i.e. can be omitted, and 12 μm. The coil is enclosed by a plastic layer 514 and is further supported by a board 515 that is schematically shown.

According to another exemplary embodiment of the method the first conductive layer has a thickness between 20 μm and 100 μm, e.g. a thickness between 40 μm and 50 μm, and/or the intermediate layer has a thickness between 0.1 μm and 10 µm, e.g. about 1 µm, and/or the second conductive layer has a thickness between 10 µm and 75 µm, e.g. between 25 µm and 35 µm.

According to another exemplary embodiment of the method the first conductive layer and/or the second conductive layer comprises a material selected from the group consisting of nickel (Ni), palladium (Pd), gold (Au), silver (Ag), and any alloy thereof.

All these materials may be suitable to adhere to the intermediate layer and may also proper adhere to further layers and/or components bonded thereon.

According to another exemplary embodiment of the method the intermediate comprises a material selected from the group consisting of copper (Cu), aluminum (Al), FeNi, FeCrNi, stainless steel, and any alloy thereof.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A method of manufacturing an inductor embedded into a semiconductor chip package, which method comprises:
   providing a carrier having, between a first side and an opposite second side, a first conductive layer, an intermediate layer, and a second conductive layer,
   forming an inductor and contact pads for the chip by patterning the first conductive layer from the first side of the carrier;
   assembling a chip to the carrier and providing an encapsulation over the chip, further anchoring the inductor and the contact pads, and
   forming terminals of the package which are connected to at least some of the contact pads, by patterning the second conductive layer from the second side of the carrier.

2. The method according to claim 1, wherein the embedded inductor has a spiral shape.

3. The method as claimed in claim 1, wherein the embedded inductor is an embedded dipole antenna.

4. The method according to claim 1, wherein a first coil configuration is defined in an etch mask on top of the first conductive layer, said coil comprising a track with a width such as that during etching of the first conductive layer underlying the etch mask is removed resulting in a freestanding coil configuration.

5. The method as claimed in claim 4, wherein a further coil configuration is defined in the etch mask and is laterally spaced apart from the first coil configuration.

6. The method as claimed in claim 5, wherein the further coil configuration comprises a track with a width such that during etching of the first conductive layer the further coil configuration is also defined in the first conductive layer.

7. The method as claimed in claim 1, wherein a coil configuration is defined in an etch mask on top of the first conductive layer, said coil configuration comprising a track with a width such as that during etching of the first conductive layer the coil configuration is also defined in the first conductive layer.

8. The method as claimed in claim 1, wherein an embedded coil forms part of a DC-DC converter circuit.

9. The method as claimed in claim 1, wherein a contact pad is coupled to an end of a coil configuration and connected to a terminal.

10. A semiconductor package having an inductor embedded therein, the package comprising:
    a carrier having, between a first side and an opposite second side, a first conductive layer, an intermediate layer, and a second conductive layer;
    an inductor and contact pads patterned in the first conductive layer from the first side of the carrier;
    a chip assembled in the carrier, the chip and inductor in an encapsulation, the encapsulation anchoring the inductor and contact pads; and
    terminals of the package, the terminals connected to at least some of the contact pads, the terminals patterned by the second conductive layer from the second side of the carrier.

* * * * *